US010665803B2

(12) United States Patent
Rand et al.

(10) Patent No.: US 10,665,803 B2
(45) Date of Patent: May 26, 2020

(54) SOLID-STATE ORGANIC INTERMEDIATE-BAND PHOTOVOLTAIC DEVICES

(71) Applicant: THE TRUSTEES OF PRINCETON UNIVERSITY, Princeton, NJ (US)

(72) Inventors: Barry P. Rand, Princeton, NJ (US); YunHui L. Lin, West Windsor, NJ (US)

(73) Assignee: THE TRUSTEEES OF PRINCETON UNIVERSITY, Princeton, NJ (US)

( * ) Notice: Subject to any disclaimer, the term of this patent is extended or adjusted under 35 U.S.C. 154(b) by 0 days.

(21) Appl. No.: 16/094,980

(22) PCT Filed: Apr. 21, 2017

(86) PCT No.: PCT/US2017/028821
§ 371 (c)(1),
(2) Date: Oct. 19, 2018

(87) PCT Pub. No.: WO2017/184969
PCT Pub. Date: Oct. 26, 2017

(65) Prior Publication Data
US 2019/0097148 A1 Mar. 28, 2019

Related U.S. Application Data

(60) Provisional application No. 62/326,470, filed on Apr. 22, 2016.

(51) Int. Cl.
H01L 51/42 (2006.01)
H01L 33/06 (2010.01)
(Continued)

(52) U.S. Cl.
CPC .......... H01L 51/4246 (2013.01); H01L 33/04 (2013.01); H01L 33/06 (2013.01);
(Continued)

(58) Field of Classification Search
CPC ............. H01L 51/0036; H01L 51/0077; H01L 51/0078; H01L 51/0084; H01L 51/0085;
(Continued)

(56) References Cited

U.S. PATENT DOCUMENTS 6,310,360 B1 * 10/2001 Forrest ................ H01L 51/0084
257/102
9,196,860 B2 * 11/2015 Xia ......................... H01L 51/52
(Continued)

OTHER PUBLICATIONS

International Search Report and Written Opinion corresponding to PCT/US2017/028821, dated Jul. 14, 2017, 7 pages.

Primary Examiner — Golam Mowla
(74) Attorney, Agent, or Firm — J. Clinton Wimbish; Nexsen Pruet, PLLC

(57) ABSTRACT

In one aspect, solid-state organic intermediate-band photovoltaic devices are provided. A solid-state organic intermediate-band photovoltaic device, in some embodiments, comprises an organic electron donor and an organic electron acceptor, wherein the organic electron donor comprises a singlet energy level separated from a triplet energy level by an energy gap. The device also comprises a triplet sensitizer comprising singlet and triplet energy levels falling within the singlet-triplet energy gap of the electron donor.

20 Claims, 11 Drawing Sheets

(51) Int. Cl.
*H01L 33/04* (2010.01)
*H01L 51/50* (2006.01)
*H01L 51/00* (2006.01)

(52) U.S. Cl.
CPC .......... *H01L 51/4253* (2013.01); *H01L 51/50* (2013.01); *H01L 51/0035* (2013.01); *H01L 51/0037* (2013.01); *H01L 51/0046* (2013.01); *H01L 51/0056* (2013.01); *H01L 51/0057* (2013.01); *H01L 51/0068* (2013.01); *H01L 51/0072* (2013.01); *H01L 51/0087* (2013.01); *Y02E 10/549* (2013.01)

(58) Field of Classification Search
CPC ............. H01L 51/0087; H01L 51/5028; H01L 51/5092; H01L 51/5262; H01L 51/56; H01L 2251/55; H01L 2251/552; C09K 2211/185; C09B 47/045
See application file for complete search history.

(56) References Cited

U.S. PATENT DOCUMENTS

| | | | |
|---|---|---|---|
| 2009/0235971 A1* | 9/2009 | Pfeiffer | B82Y 10/00 136/244 |
| 2009/0308456 A1* | 12/2009 | Rand | H01L 51/0038 136/261 |
| 2011/0304263 A1* | 12/2011 | Xia | H01L 27/3211 313/504 |
| 2013/0150576 A1* | 6/2013 | Hotta | C07D 487/04 544/209 |
| 2014/0151646 A1* | 6/2014 | Xia | H01L 51/52 257/40 |
| 2014/0158993 A1* | 6/2014 | So | H01L 51/0085 257/40 |
| 2015/0263203 A1 | 9/2015 | Lewis et al. | |
| 2015/0270501 A1 | 9/2015 | Thompson et al. | |
| 2016/0104847 A1 | 4/2016 | Xia et al. | |

* cited by examiner

SOLID-STATE ORGANIC INTERMEDIATE-BAND PHOTOVOLTAIC DEVICES

RELATED APPLICATION DATA

This application is a U.S. National Phase of PCT/US2017/028821, filed Apr. 21, 2017, The present application which claims priority pursuant to 35 U.S.C. § 119(e) to U.S. Provisional Patent Application Ser. No. 62/326,470 filed Apr. 22, 2016, each of which is incorporated herein by reference in its entirety.

STATEMENT OF GOVERNMENT RIGHTS

This invention was made with government support under Grant No. DE-SC0012458 awarded by the Department of Energy. The government has certain rights in the invention.

FIELD

The present invention relates to photovoltaic devices and, in particular, to solid-state organic photovoltaic devices comprising intermediate-band architectures.

BACKGROUND

Conventional solar cells are unable to productively harness photons with energy below the bandgap of its active layers. As a result, large swaths of the solar spectrum are wasted, partly accounting for why the maximum theoretical power conversion efficiency (PCE) of conventional solar cells cannot exceed 32% under standard conditions. The intermediate band solar cell (IBSC) concept circumvents this limitation by introducing a narrow band of states within the bandgap of the absorber material that serves as a stepping-stone for the absorption of low energy photons that would have otherwise been lost. While such a device is able to utilize sub-bandgap photons, charges are still extracted via the outer band edges, so that the enhancement in photocurrent due to increased absorption is not achieved at the expense of photovoltage.

To date, demonstrations of IBSC devices are dominated by inorganic semiconductor approaches, in which the intermediate band states are typically achieved by extreme lattice mismatch or dense sheets of quantum dots. However, this approach has historically been frustrated by materials limitations and fabrication challenges. Moreover, charge recombination via the intermediate band has proven difficult to avoid. In 2008, the theoretical foundations were laid for an IBSC based on molecular materials and triplet-triplet annihilation upconversion (TTA-UC). It was proposed that the molecular triplet level of an organic material (the TTA host) serves as the intermediate band. The molecular IBSC is fundamentally different from its inorganic relative in that its intermediate band comprises long-lived (radiatively dark) triplet states rather than a partially-filled band of free carrier states. This difference constitutes a practical advantage for implementing the IBSC because it simplifies the requirement of preventing electrical recombination through the intermediate band since relaxation of triplet excitons to the singlet ground state is spin-forbidden. Several molecular IBSC devices have been constructed employing small molecule sensitizer and acceptor pairs in conjunction with liquid electrolyte. The requirement of liquid electrolyte presents several disadvantages including increased fabrication costs and limited device durability.

SUMMARY

In one aspect, solid-state organic intermediate-band photovoltaic devices are provided. In being solid-state, the intermediate-band photovoltaic devices do not employ liquid electrolyte. Briefly, a solid-state organic intermediate-band photovoltaic device comprises an organic electron donor and an organic electron acceptor, wherein the organic electron donor comprises a singlet energy level separated from a triplet energy level by an energy gap. The device also comprises a triplet sensitizer comprising singlet and triplet energy levels falling within the singlet-triplet energy gap of the electron donor. In other embodiments, a solid-state organic intermediate-band photovoltaic device comprises an organic electron donor and an organic electron acceptor, wherein the organic electron acceptor comprises a singlet energy level separated from a triplet energy level by an energy gap. The device also comprises a triplet sensitizer comprising singlet and triplet energy levels falling within the singlet-triplet energy gap of the electron acceptor. As described further herein, the triplet sensitizer can be dispersed in host matrix providing a composite layer of the intermediate-band photovoltaic device. Host matrix, in some embodiments, can support TTA-UC. Alternatively, the host matrix can comprise a triplet energy level facilitating triplet transfer to a material supporting TTA-UC, such as the organic electron donor and/or organic electron acceptor.

In another aspect, methods of enhancing efficiency of intermediate-band photovoltaic devices are provided. In some embodiments, a method of enhancing efficiency comprises positioning a spacer layer between a triplet sensitizer and an electron acceptor, the spacer layer comprising an electron donor having a singlet-triplet energy gap, wherein the triplet sensitizer comprises singlet and triplet energy levels falling within the singlet-triplet energy gap permitting TTA-UC in the spacer layer.

These and other embodiments are further described in the following detailed description.

DETAILED DESCRIPTION

Embodiments described herein can be understood more readily by reference to the following detailed description and examples and their previous and following descriptions. Elements, apparatus and methods described herein, however, are not limited to the specific embodiments presented in the detailed description and examples. It should be recognized that these embodiments are merely illustrative of the principles of the present invention. Numerous modifications and adaptations will be readily apparent to those of skill in the art without departing from the spirit and scope of the invention.

Figure 1:
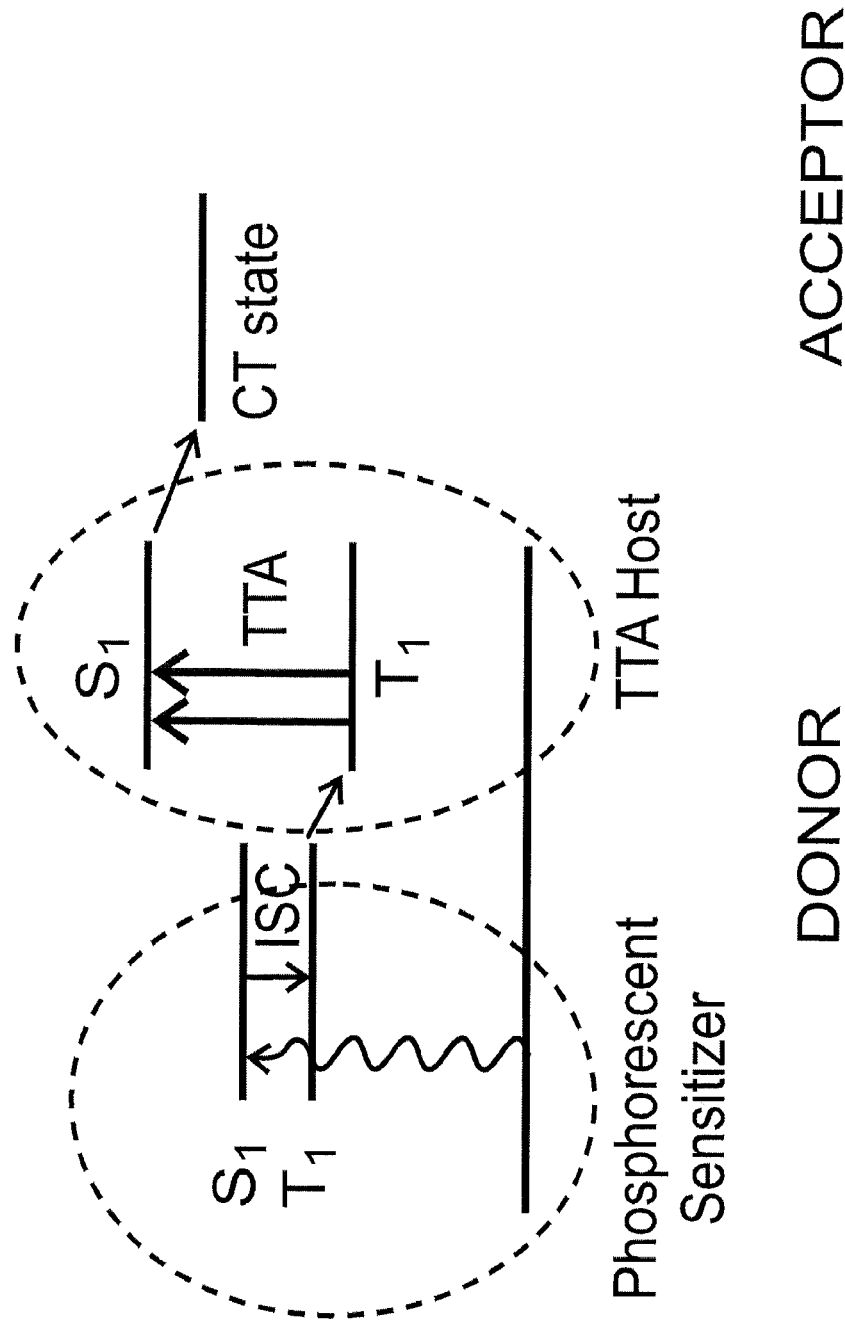
FIG. 1 is a schematic of energy levels of a solid-state organic intermediate-band solar cell (SS-IBSC) according to some embodiments.

In one aspect, solid-state organic intermediate-band photovoltaic devices are provided. A solid-state organic intermediate-band photovoltaic device, in some embodiments, comprises an organic electron donor and an organic electron acceptor, wherein the organic electron donor comprises a singlet energy level separated from a triplet energy level by an energy gap. The device also comprises a triplet sensitizer comprising singlet and triplet energy levels falling within the singlet-triplet energy gap of the electron donor. As described further herein, the triplet sensitizer can be dispersed in a host matrix providing a composite layer of the intermediate-band photovoltaic device. Host matrix, in some embodiments, can support TTA-UC. FIG. 1 is a schematic of energy levels of an intermediate-band photovoltaic device according to some embodiments. In the embodiment of FIG. 1, triplet sensitizer is dispersed in an electron donor host. The singlet and triplet energy levels of the triplet sensitizer fall within the singlet-triplet energy gap of the electron donor host. Accordingly, triplet states of the electron donor host can be populated by exciton transfer from triplet states of the triplet sensitizer. Upon transfer, the triplet states may interact with one another and undergo upconversion to the electron donor singlet state followed by charge transfer (CT) to the electron acceptor.

Turning now to specific components, the triplet sensitizer can be selected according to several considerations including the band structure of the host, electron donor and/or electron acceptor of the device and the desired radiation absorption profile. In some embodiments, triplet sensitizer has a bandgap of 0.5 eV to 2 eV. For example, a triplet sensitizer can exhibit peak absorption in the range of 600 nm to 1500 nm, in some embodiments. Moreover, triplet sensitizers can be selected to have minimal energy gap between singlet and triplet states. In some embodiments, the singlet-triplet energy gap of a triplet sensitizer is less than about 0.2 eV or less than 0.1 eV. Singlet and triplet states close in energy can minimize energy loss by the triplet sensitizer during intersystem crossing (ISC). In some embodiments, for example, triplet sensitizer comprises a thermally activated delayed fluorescent (TADF) species. TADF species can comprise organic small molecules or polymeric species. Triplet sensitizer may also comprise other organic small molecules, including various dyes. In some embodiments, triplet sensitizer can comprise conjugated polymer. Alternatively, triplet sensitizer can comprise one or more metal complexes, including transition metal complexes. Suitable transition metal complexes can comprise transition metal selected from Group VIIIB of the Periodic Table. In some embodiments, the transition metal complex triplet sensitizer comprises platinum or iridium. Transition metal complexes of triplet sensitizers can also include metal porphyrins and phthalocyanines. Triplet sensitizers may also comprise colloidal nanocrystals, such as metal chalcogenide nanocrystals including lead sulfide and/or lead selenide.

The triplet sensitizer can be dispersed in a host matrix to provide a composite layer of the solid-state intermediate-band photovoltaic device. The triplet sensitizer can be present in the composite layer in any amount consistent with the objectives of the present invention. In some embodiments, the triplet sensitizer is present in an amount of 0.5 to 30 weight percent of a composite layer. The triplet sensitizer may also be present in a composite layer in an amount selected from Table I.

TABLE I

| Triplet Sensitizer (wt. % of Composite Layer) |
|---|
| 1-25 |
| 2-20 |
| 5-15 |
| 0.5-10 |
| 1-10 |
| 4-12 |

In some embodiments, the composite layer forms a heterojunction with electron acceptor of the solid-state intermediate-band photovoltaic device. In some embodiments, a planar heterojunction is formed between the composite layer and a layer of the electron acceptor. In other embodiments, the composite layer and electron acceptor are inter-diffused resulting in bulk heterojunction formation. When forming a heterojunction with the electron acceptor, the host matrix can comprise matrix electron donor. Matrix electron donor can comprise any organic species having band structure illustrated in FIG. 1 operable to support TTA-UC in conjunction with the triplet sensitizer. For example, matrix electron donor can comprise conjugated polymer. In some embodiments, conjugated polymer can be selected to have a triplet state lying close in energy to the triplet state of the triplet sensitizer to minimize energy loss during triplet transfer. In some embodiments, triplet levels of the triplet sensitizer and conjugated polymer are resonant or separated by less than 0.2 eV or 0.1 eV.

Conjugated electron donors can comprise thiophenes including α-2T, α-3T, α-4T, α-5T, α-6T, α-7T, poly(3-hexylthiophene) (P3HT), poly(3-octylthiophene) (P3OT) and/or polythiophene (PTh). In some embodiments, polymers suitable for use as matrix electron donor comprise semiconducting polymers. In one embodiment, semiconducting polymers include phenylene vinylenes, such as poly(phenylene vinylene) and poly(p-phenylene vinylene) (PPV), and derivatives thereof. In other embodiments, semiconducting polymers can comprise polyfluorenes, polynaphthalenes and derivatives thereof. Semiconducting polymers of matrix electron donor can also comprise poly(2-vinylpyridine) (P2VP), polyamides, poly(N-vinylcarbazole) (PVCZ), polypyrrole (PPy), polyaniline (PAn), poly(naphthalene vinylene), poly(naphthalene vinylene) copolymers, cyano-poly(phenylene vinylene), cyano-poly(phenylene vinylene) copolymers and/or derivatives thereof. Matrix electron donor polymer, in some embodiments, comprises one or more species of poly(fluorenylene ethynylene), poly(fluorenylene ethynylene) copolymers and/or derivatives thereof. Matrix electron donor polymeric species may also comprise one or more transition metals such as platinum or iridium to enhance or alter the singlet-triplet energy gap of the polymer. Matrix electron donor may also comprise one or more organic small molecules satisfying the band structure requirements detailed above.

A composite layer can have any desired thickness. Thickness of a composite layer may be selected according to several considerations including, but not limited to, desired radiation absorption characteristics of the composite layer, distance of singlet exciton travel for transfer to the electron acceptor and/or the presence of any additional layers between the composite layer and electron acceptor. In some embodiments, a composite layer has thickness of 10 nm to 500 nm. A composite layer may also have thickness selected from Table II.

TABLE II

| Composite Layer Thickness (nm) |
| --- |
| 15-100 |
| 20-80 |
| 40-60 |
| 20-200 |

The organic electron acceptor can comprise any material establishing a charge transfer interface within the singlet-triplet energy gap of the matrix electron donor. In some embodiments, the electron acceptor comprises one or more semiconducting small organic molecules, including perylene derivatives. The acceptor, for example, can comprise diindenoperylene (DIP), N,N'-bis(2,5-di-tert-butylphenyl)3,4,9,10-perylenedicarboxamide (PDCDT), N,N'-dipentyl-3,4,9,10-perylenedicarboxamide (PenPTC), 3,4,9,10-perylenetetracarboxylic dianhydride (PTCDA) and/or 3,4,9,10-perylenetetracarboxylic acid diimide (PTCDI) or fullerenes or fullerene derivatives.

As described herein, a spacer layer can be positioned between the composite layer and electron acceptor, in some embodiments. The spacer layer can comprise an electron donor operable to receive triplet transfer from the composite layer and support TTA-UC. Notably, the spacer layer can separate the site of triplet sensitization (composite layer) from the site of TTA-UC, thereby reducing the chance of counter-productive back-transfers of upconverted singlets to the triplet sensitizer. The spacer can also serve as a triplet collection layer, providing a volume in which triplets received from the composite layer can interact with one another and potentially undergo upconversion. In some embodiments, electron donor of the spacer layer is the same material as the matrix electron donor of the composite layer. In other embodiments, electron donor of the spacer layer differs from matrix electron donor. Electron donor of the spacer layer, for example, can comprise a conjugated polymer that differs from the matrix electron donor. In such embodiments, difference in triplet energy levels between the matrix electron donor and spacer electron donor can be minimized to curtail energy loss in triplet transfer. Electron donor of the spacer, for example, can have a triplet energy level less than 0.2 eV or less than 0.1 eV below the triplet energy level of the matrix electron donor.

Thickness of the spacer layer can be selected according to several considerations including, but not limited to, distance of singlet exciton travel for transfer to the electron acceptor and sufficient thickness for inhibition of singlet back-transfer. In some embodiments, a spacer layer has thickness of less than 100 nm. A spacer layer may also have thickness selected from Table III.

TABLE III

| Spacer Layer Thickness (nm) |
| --- |
| 5-70 |
| 10-60 |
| 15-40 |
| 20-30 |

When an electron donor spacer is present, the organic electron acceptor can comprise any material establishing a charge transfer interface within the singlet-triplet energy gap of the electron donor. In some embodiments, the electron acceptor comprises one or more semiconducting small organic molecules, including perylene derivatives described above.

In alternative embodiments, a solid-state intermediate-band photovoltaic device comprises an organic electron donor and an organic electron acceptor, wherein the organic electron acceptor comprises a singlet energy level separated from a triplet energy level by an energy gap. The device also comprises a triplet sensitizer comprising singlet and triplet energy levels falling within the singlet-triplet energy gap of the electron acceptor. In some embodiments, a composite layer of the solid-state intermediate-band photovoltaic device employs electron acceptor as host matrix for the triplet sensitizer. As described herein, triplet sensitizer and matrix electron acceptor are chosen such that the sensitizer singlet and triplet energy levels fall within the matrix electron acceptor singlet-triplet energy gap, thereby enabling triplet transfer from the sensitizer to the acceptor for TTA-UC. In some embodiments, triplet sensitizer and matrix electron acceptor are selected from sensitizer and acceptor materials described above. The triplet sensitizer can be present in the composite layer in any amount consistent with the objectives of the present invention. In some embodiments, the triplet sensitizer is present in the composite layer of matrix electron acceptor in an amount selected from Table I herein.

In some embodiments, a composite layer comprising a triplet sensitizer and matrix electron acceptor forms a heterojunction with electron donor of the solid-state intermediate-band photovoltaic device. In some embodiments, a planar heterojunction is formed between the composite layer and a layer of the electron donor. In other embodiments, the composite layer and electron donor are inter-diffused resulting in bulk heterojunction formation. Alternatively, a spacer layer is positioned between the composite layer and electron donor layer. The spacer layer can comprise electron acceptor operable to receive triplet transfer from the composite layer and support TTA-UC. As described herein, the spacer layer of electron acceptor can separate the site of triplet sensitization (composite layer) from the site of TTA-UC, thereby reducing the chance of counter-productive back-transfers of upconverted singlets to the triplet sensitizer. The spacer can also serve as a triplet collection layer, providing a volume in which triplets received from the composite layer can interact with one another and potentially undergo upconversion. In some embodiments, electron acceptor of the spacer layer is the same material as the matrix electron acceptor of the composite layer. In other embodiments, electron acceptor of the spacer layer differs from matrix electron acceptor. Electron acceptor of the spacer layer, for example, can comprise semiconducting organic small molecule differing from the matrix electron acceptor. In such embodiments, difference in triplet energy levels between the matrix electron acceptor and spacer electron acceptor can be minimized to curtail energy loss in triplet transfer. Electron acceptor of the spacer, for example, can have a triplet energy level less than 0.2 eV or less than 0.1 eV below the triplet energy level of the matrix electron acceptor. Moreover, thickness of the spacer comprising electron acceptor can be selected from Table III above, in some embodiments.

Solid-state organic intermediate-band photovoltaic devices described herein also comprise anode and cathode. The anode and/or cathode of a photovoltaic device described herein, in some embodiments, is formed of a radiation transmissive material. In being radiation transmissive, the anode and/or cathode is transparent or substantially transparent for portions of the electromagnetic spectrum characteristic of solar spectral irradiation. In some embodiments, the anode and/or cathode are formed of a radiation transmissive metal oxide. Suitable radiation transmissive metal oxides can include tin oxide (ITO), gallium indium tin oxide (GITO), zinc indium tin oxide (ZITO), indium zinc oxide (IZO) and silver zinc oxide (AZO) and chemically-functionalized versions of metal oxides such as fluorine-doped tin oxide (FTO). In other embodiments, radiation transmissive materials for the anode and/or cathode can include organic materials such conductive or semiconductive polymeric species. Suitable polymeric species can comprise polyaniline (PANI) and its chemical relatives, such as PANI-PAAMPSA. In some embodiments, 3,4-polyethylenedioxythiophene (PEDOT) can be a suitable radiation transmissive polymeric material for the anode and/or cathode. Nanowire constructions can also be used as radiation transmissive material for the anode and/or cathode. In some embodiments, for example, a radiation transmissive anode and/or cathode can be a metal-nanowire mesh, such as silver nanowires dispersed in polymeric matrix. Metal films sufficiently thin to transmit significant near-ultraviolet, visible and/or infrared radiation may also be employed as anode and/or cathode. In some embodiments, the anode and/or cathode exhibit average transmittance in the visible light region of 80 percent to 100 percent. In other embodiments, the anode or cathode may be opaque. The anode or cathode for example, may be formed of metal, such as aluminum, silver or copper of sufficient thickness to reflect light or otherwise block light transmission. Moreover, thin-film layers of molybdenum oxide or LiF can be employed adjacent to, or mixed with, transmissive or opaque anode and/or cathode architectures to improve photovoltaic device performance or device transparency in the visible and/or infrared region(s).

Additionally, solid-state intermediate-band photovoltaic devices described herein can comprise one or more charge transport layers and/or exciton blocking layers. A hole transport layer (HTL), in some embodiments, is positioned between the anode and one or more layers of electron donor. For example, an HTL can comprise one or more organic or inorganic layers such as poly(3,4-ethylenedioxythiophene): poly(styrenesulfonate) PEDOT:PSS, polyaniline-poly(2-acrylamido-2-methyl-1-propane-sulfonic acid) PANI-PAAMPSA and/or transition metal oxide. An electron transport layer (ETL), in some embodiments, is positioned between the cathode and one or more layers of electron acceptor. An ETL can comprise one or more organic or inorganic layers such as bathocuproine (BCP), bathophenanthroline (Bphen), calcium fluoride, lithium fluoride, poly[(9, 9-bis(3-(N,N-dimethylamino)propyl)-2,7-fluorene)-alt-2,7-(9,9-dioctylfluorene)] PFN and/or transition metal oxide. Suitable transition metal oxide for an ETL can comprise titanium oxide ($TiO_x$) and/or zinc oxide. HTL and/or ETL layers can be deposited by any method not inconsistent with the objectives of the present invention. HTL and/or ETL layers can be deposited by sputtering or thermal evaporation. In other embodiments, HTL and/or ETL layers can be deposited by solution-based techniques such as spin coating, blade coating, knife coating, slot-die coating, screen printing, flexographic printing, Gravure printing, ink jet printing or spray coating. In further embodiments, HTL and/or ETL layers may be deposited by lamination.

In another aspect, methods of enhancing efficiency of intermediate-band photovoltaic devices are provided. In some embodiments, a method of enhancing efficiency comprises positioning a spacer layer between a triplet sensitizer and an electron acceptor, the spacer layer comprising an electron donor having a singlet-triplet energy gap, wherein the triplet sensitizer comprises singlet and triplet energy levels falling within the singlet-triplet energy gap permitting TTA-UC in the spacer layer. The spacer layer can separate the site of triplet sensitization from the site of TTA-UC, thereby reducing the chance of counter-productive back-transfers of upconverted singlets to the triplet sensitizer. The spacer layer can also serve as a triplet collection layer, providing a volume in which triplets received from the triplet sensitizer can interact with one another and potentially undergo upconversion. The spacer layer can have any desired thickness consistent with the function of enhancing TTA-UC and efficiency of the photovoltaic device. For example, the spacer can have thickness selected from Table III above. A spacer layer may find application in solid-state devices described herein as well as intermediate-band devices employing liquid electrolyte.

These and other embodiments are further illustrated by the following non-limiting examples.

Example 1—Solid-State Intermediate-Band Solar Cell (SS-IBSC)

A material system consisting of platinum(II) tetraphenyltetrabenzoporphyrin (PtTPBP) as the triplet sensitizer and α-sexithiophene (α-6T) and diindenoperylene (DIP) as donor and acceptor (FIG. 2a), respectively, was selected to meet the energetic requirements of the SS-IBSC. First, the singlet and triplet levels of PtTPBP are nested between those of α-6T (which serves as the TTA host) to enable the triplet sensitization cycle. Second, the α-6T/DIP CT state lies above the triplet level of α-6T in order to constrain photocurrent generation only to α-6T singlet excitons generated by means of TTA-UC (FIG. 2b). As an experimental control, parallel investigations of a second device, a triplet sensitized solar cell (TSSC), were performed. In the TSSC, $C_{60}$ is substituted for DIP as the acceptor material, which results in a donor/acceptor CT state that is lower in energy than the triplet level of α-6T (FIG. 2b). Consequently, triplets that are generated in α-6T by the sensitization process are readily dissociated at the donor/acceptor interface, bypassing TTA-UC and contributing directly to photocurrent. This control allows different mechanisms of photocurrent generation in the two types of devices to be distinguished.

The CT state energies of the α-6T/$C_{60}$ and α-6T/DIP interfaces were characterized by electroluminescence (EL) and external quantum efficiency (EQE) measurements on the relevant interfaces in a device configuration. The EL spectrum of a planar heterojunction α-6T/DIP device is shown in FIG. 2c top, and contains contributions from α-6T and DIP excitons in addition to CT excitons formed at the interface. Emission from CT excitons dominates at low driving voltages. The EL spectrum of this interface has been previously deconvolved, with the conclusion that the peak at 1.82 eV is attributable to the CT state. The CT state energy of the α-6T/DIP interface has also been characterized previously by photoelectron spectroscopy and an investigation of the temperature dependence of device open-circuit voltage, with a value of 1.8-1.9 eV reported in either case. The EQE measurement on a planar heterojunction α-6T/$C_{60}$ device is shown in FIG. 2c bottom, and exhibits the characteristic low energy parabolic CT feature when viewed on a semilog scale. Using Marcus theory of photoinduced electron transfer, it was determined the CT state energy to be 0.91 eV for the α-6T/$C_{60}$ system. Moreover, the EL spectrum for this system shows emission from low energy CT excitons of similar energy and the value reported in literature, determined from photoelectron spectroscopy, is consistent. As it is critical to TSSC and SS-IBSC device operation, it was concluded that the α-6T triplet energy is above and below the CT state energies of α-6T/$C_{60}$ and α-6T/DIP heterojunctions, respectively. Pump-probe transient absorption spectroscopy (TAS) is useful in understanding exciton dynamics in the α-6T:PtTPBP host:guest system. As shown in FIG. 3a, isolated PtTPBP molecules in a polystyrene matrix show pronounced absorption bands at 433 and 617 nm with weaker bands at 478, 568, and 670 nm. On the other hand, the neat α-6T film absorbs broadly in the visible spectrum with peaks at 448, 478, and 519 nm. When α-6T is doped with PtTPBP, as shown in FIG. 3d, the absorption spectrum is a superposition of the individual PtTPBP and α-6T spectra with minor band shifts owing to the altered molecular environment in the mixed film. No additional absorption bands are observed at these doping concentrations that would indicate charge transfer transitions. Emission peaks that are related to excimer or exciplex-like species have sometimes been observed, but are absent in the present system.

Figure 3D:
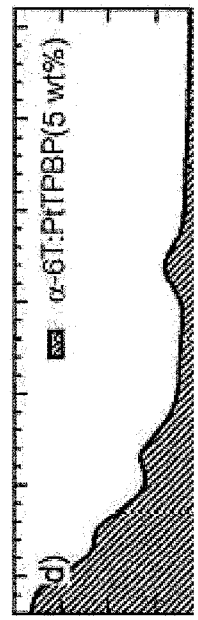
FIGS. 3a and 3d are steady state absorption spectra of PtTPBP isolated in polystyrene matrix and α-6T:PtTPBP (5 wt. %) film, respectively.
Figure 3A:
Figures 3B, 3E:
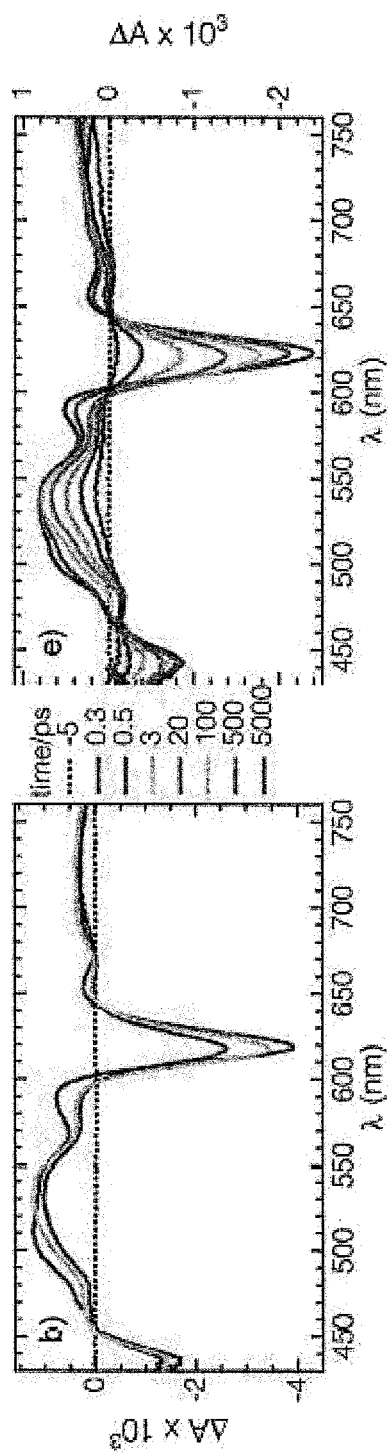
FIGS. 3b and 3e illustrate differences in absorption spectra (ΔA) of the isolated PtTPBP and α-6T:PtTPBP (5 wt %) films between 300 fs and 5 ns.
Figures 3C, 3F:
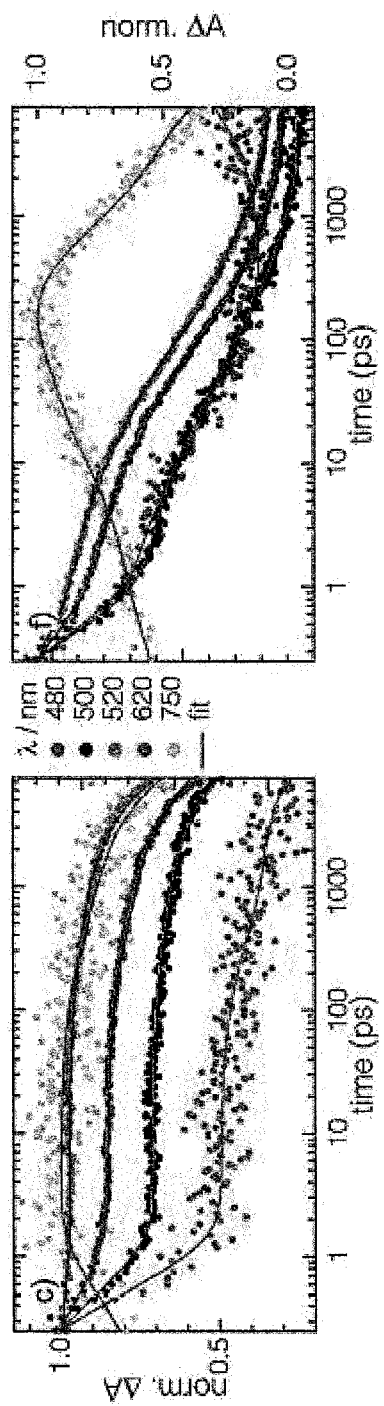
FIGS. 3c and 3f illustrate the time evolution of transient amplitudes at select wavelengths.

The non-overlapping absorption spectra of PtTPBP and α-6T in the region beyond 600 nm was exploited to selectively excite the PtTPBP molecules. The difference absorption spectra (ΔA) of the isolated PtTPBP and α-6T:PtTPBP (5 wt %) films between 300 fs and 5 ns are shown in FIGS. 3b and 3e. Upon excitation at 620 nm, the isolated PtTPBP film shows negative ΔA bands that overlap with the steady-state absorption spectra in FIG. 3a, and are therefore assigned to depopulation of the ground state of PtTPBP, $S_0^{Pt}$. Intersystem crossing to the first excited triplet state, $T_1^{Pt}$, takes place within the first picosecond after photoexcitation (τ~400-500 fs) as determined from global analysis and in agreement with literature. The lifetime of $T_1^{Pt}$ exceeds the experimental time window of our TAS apparatus (~7 ns), such that no further changes are observed in the ΔA spectra after intersystem crossing is complete. Measurements at lower excitation energies show a slight deceleration of the $T_1^{Pt}$ decay towards the end of the instrument observation window, pointing towards residual contributions from TTA in the isolated PtTPBP molecules at high excitation energies. Sensitizer-sensitizer TTA is a loss pathway in IBSC devices, but can be mitigated through the solid-state design utilized in this work, because each PtTPBP sensitizer molecule is surrounded by α-6T molecules whose mutual interaction outcompetes the ns-scale TTA process between PtTPBP molecules. The absence of steady-state emission peaks signaling sensitizer aggregation supports this fact.

In the α-6T:PtTPBP (5 wt %) film, intersystem crossing is observed in PtTPBP after excitation at 620 nm and on similar time scales as for the isolated PtTPBP. Importantly, however, the lifetime of $T_1^N$ is shortened considerably; the transient signals decay almost to zero within the experimental time window. In addition, two spectral modulations are visible—most noticeably at 480 nm but also beyond 700 nm. By comparison with an α-6T reference film and the α-6T:PtTPBP (5 wt %) film excited at 520 nm, these new features are assigned to the ground state depopulation and triplet population of α-6T, respectively.

The new ΔA transient above 700 nm, with different shape and constant amplitude between 1 ps and 1 ns in the isolated PtTPBP matrix, resembles the ΔA transient that is visible when exciting α-6T selectively at 520 nm. Additionally, as mentioned, the transient above 700 nm appears alongside the negative ground state bleach of α-6T, which is best visualized at 480 nm but also present at 448 and 520 nm. Therefore, the 700 nm transient can be assigned to an α-6T feature, confirming that the triplet states of α-6T are populated by exciton transfer from the triplet states of PtTPBP. Note that a direct singlet transfer from PtTPBP to α-6T is highly unlikely due to the large energetic barrier (~0.4 eV) and high rate of intersystem crossing in PtTPBP (on the order of $10^{12}$ $s^{-1}$). In fact, singlet transfer in the opposite direction, from α-6T to PtTPBP, is the operational pathway and can be seen as a PtTPBP ground state bleach at 620 nm, suggesting that α-6T singlets are deactivated by neighboring PtTPBP molecules (if present). Therefore, the appearance of the α-6T bleach and triplet transient in FIG. 3e cannot be explained by singlet transfer from PtTPBP to α-6T.

In summary, pump-probe transient absorption experiments with femtosecond time resolution revealed that when PtTPBP is excited, its triplet lifetime is shortened considerably in the presence of neighboring α-6T molecules as compared to isolated PtTPBP molecules in a polystyrene matrix. Moreover, this shortening of the PtTPBP triplet lifetime is correlated with the ground state depopulation and triplet population of α-6T, thus providing conclusive evidence of triplet exciton transfer between PtTPBP and α-6T, which completes the triplet sensitization cycle.

Following exciton transfer from sensitized PtTPBP molecules, triplets in α-6T undergo TTA-UC to yield high energy singlets. To verify this mechanism, the power dependence of upconverted fluorescence from α-6T:PtTPBP films was monitored. Because TTA-UC is a bimolecular process involving two triplet excitons, the yield of upconverted fluorescence follows the square of the concentration of triplets, which, at the limit of low upconversion efficiency, follows the square of the power density of the incident light.

Figure 4:
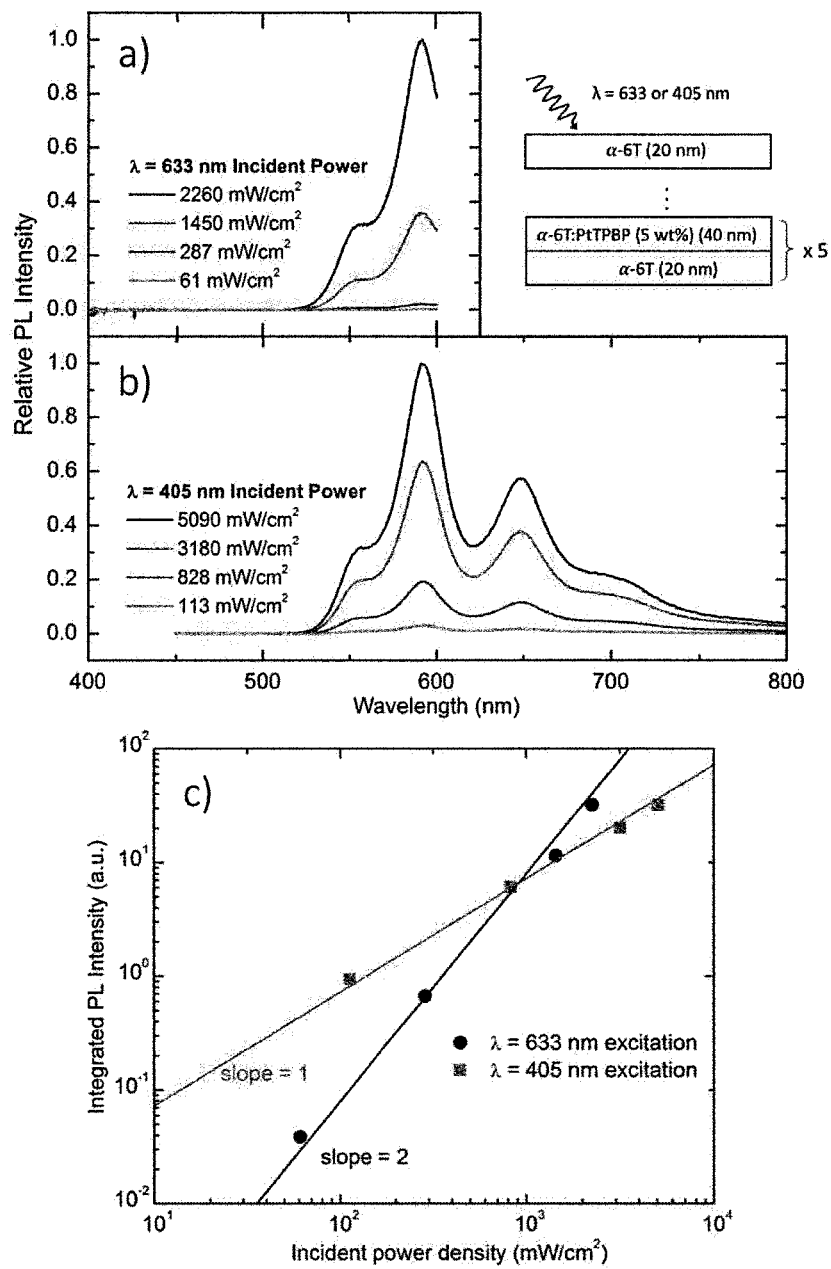
FIG. 4a illustrates emission from upconverted α-6T singlet excitons resulting from selective excitation of the PtTPBP triplet sensitizer at 633 nm.
FIG. 4b illustrates emission from α-6T singlet excitons directly excited by 405 nm radiation.
FIG. 4c illustrates photoluminescent (PL) spectra of FIGS. 4a and 4b which are integrated from 500-600 nm and plotted as a function of incident power density.

As shown in FIG. 4a, following selective excitation of the PtTPBP chromophores at λ=633 nm, the film is observed to emit shorter wavelength photons with spectral shape identical to that of α-6T, verifying that upconversion to α-6T singlets has taken place. In contrast, a pure α-6T film exhibited no such emission when excited under identical conditions. Moreover, in the sensitized film, a log-log plot of the integrated upconverted fluorescence intensity versus the incident power density at 633 nm reveals a slope of 2, which reflects the bimolecular nature of TTA-UC (FIG. 4c). On the other hand, when the film is excited at λ=405 nm, which directly excites the α-6T singlet manifold (FIG. 4b), the power dependence is linear (FIG. 4c). Taken together, these results highlight the mechanistic differences in fluorescence originating from α-6T versus PtTPBP sites, and provide conclusive evidence of the triplet sensitization and upconversion processes that underlie molecular SS-IBSCs.

At the limit of low TTA-UC efficiency, the α-6T triplet decay is dominated by first-order decay channels, such that the triplet population is related linearly to the excitation power density. Consequently, the delayed fluorescence of α-6T is expected to vary quadratically with the excitation flux ($[S_1] \propto [T_1]^2 \propto Flux^2$). However, at the limit of high TTA-UC efficiency, TTA-UC outcompetes first-order decay channels such that the α-6T triplet population is now related to the square root of the excitation flux, and the delayed fluorescence of α-6T is expected to vary linearly with the excitation power density ($[S_1] \propto [T_1]^2 \propto (\sqrt{Flux})^2$). The threshold power density at which the system transitions between low and high TTA-UC efficiency regimes is an important metric for evaluating the overall performance of devices using TTA-UC, and should be pursued in future iterations of the SS-IBSC.

To complement the spectroscopic evidence for triplet sensitization and TTA-UC in an α-6T:PtTPBP system, comparative studies of photocurrent generation in the SS-IBSC and TSSC device systems as a function of the α-6T layer thickness and as a function of background light intensity were performed. Both experiments were designed to modulate the likelihood of TTA-UC, which enhances sub-bandgap photocurrent generation in the IBSC devices but detracts from it in the TSSC control devices.

Figure 2A:
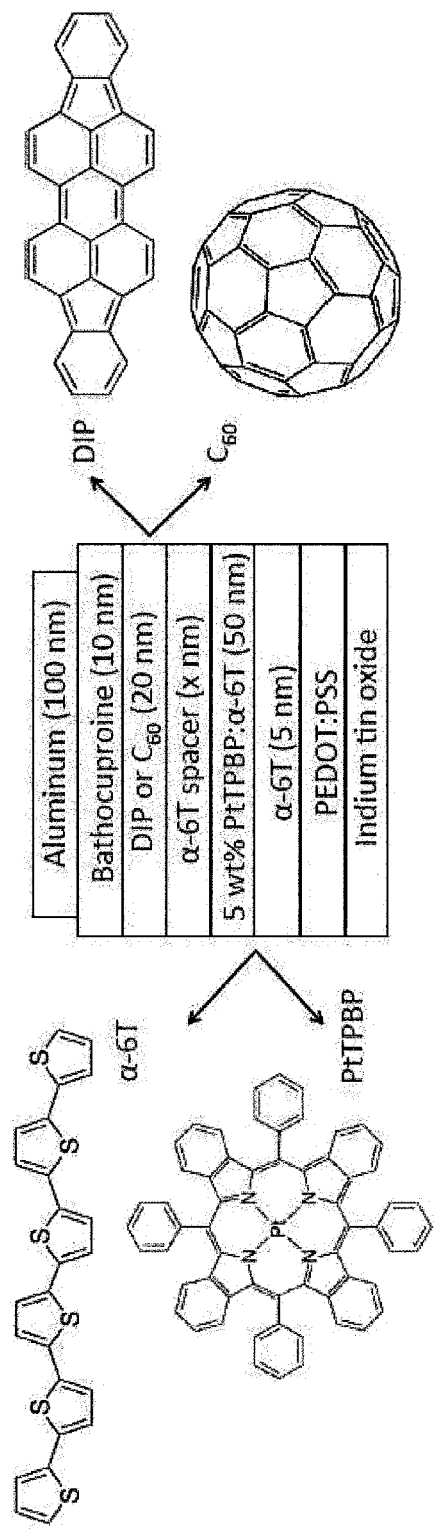
FIG. 2a illustrates construction of a SS-IBSC according to some embodiments relative to a triplet sensitized solar cell (TSSC).
Figure 2B:
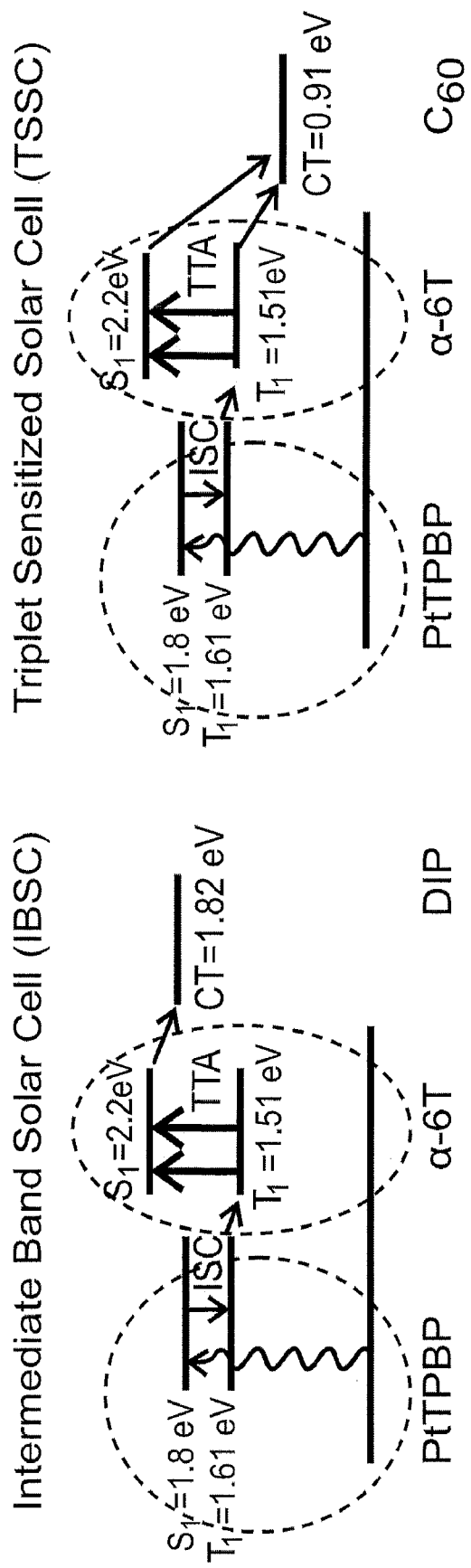
FIG. 2b illustrates the band structure of a SS-IBSC according to one embodiment described herein relative to a TSSC.
Figure 2C:
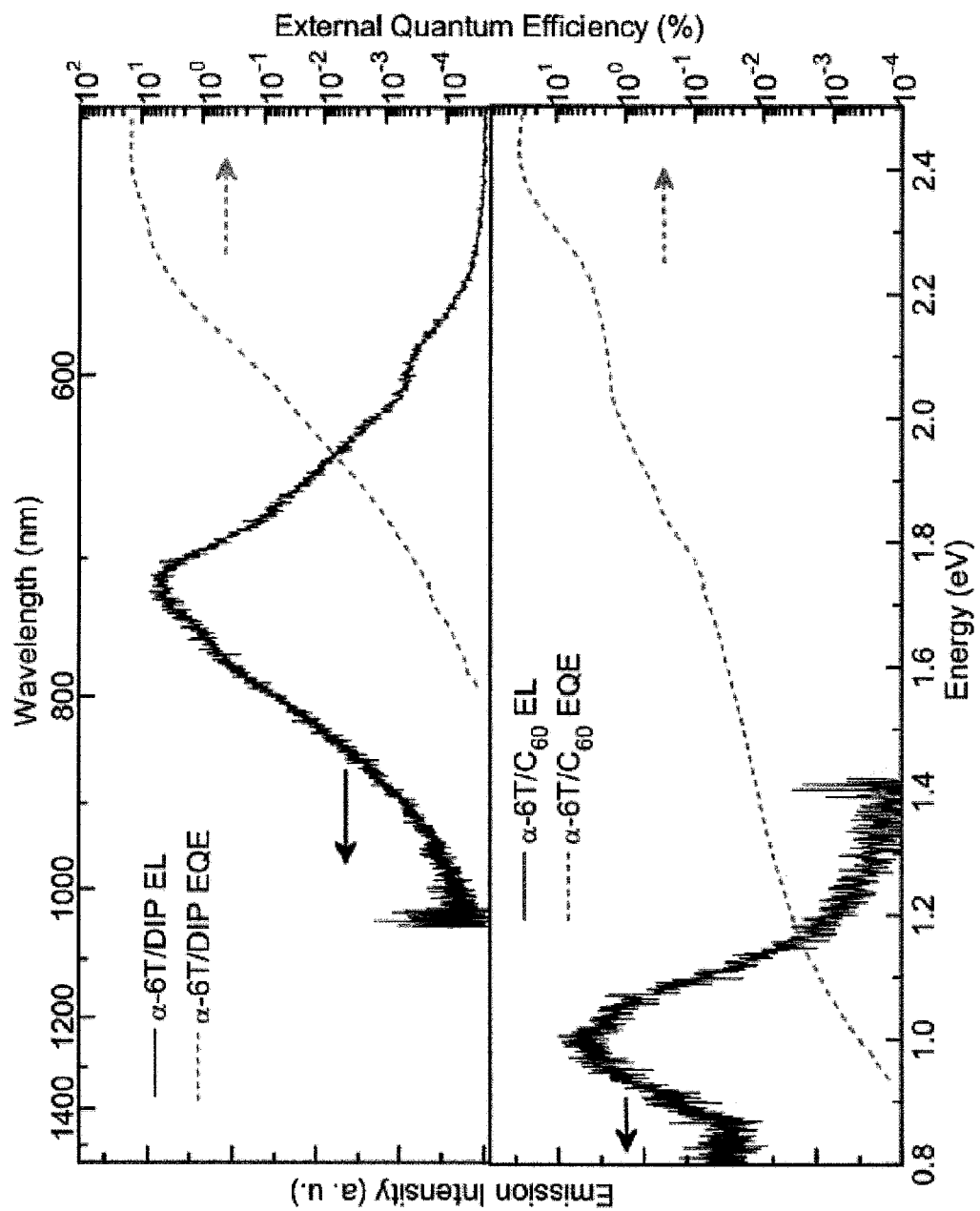
FIG. 2c provides electroluminescent (EL) spectra and external quantum efficiency (EQE) of SS-IBSC and TSSC devices employed to characterize charge transfer (CT) state energy of donor/acceptor interfaces according to some embodiments.

As shown in FIG. 2a, the IBSC and TSSC devices were fabricated with a 50 nm α-6T layer doped with PtTPBP followed by an undoped α-6T "spacer" layer, deposited with thicknesses between 0 and 65 nm in 5 nm increments. The motivation behind this neat α-6T spacer is to help separate the site of α-6T triplet sensitization from the site of TTA-UC, thereby reducing the chance of counterproductive back-transfer of upconverted α-6T singlets to PtTPBP. To confirm the spacer structure, depth-resolved x-ray photoelectron spectroscopy showed that an α-6T spacer achieves complete coverage over the α-6T:PtTPBP (5 wt %) film within only a couple of nm.

The triplets of α-6T are reported to have a relatively long lifetime of 24 μs in solution, such that introducing a neat α-6T spacer layer provides opportunities for upconversion interactions between long-lived, diffusive triplets without competition from quenching processes on sensitizer sites. However, the thicker the spacer layer, the more diluted the triplets become and the less efficiently excitons diffuse to the dissociating donor/acceptor interface, such that we expect an optimum spacer thickness to exist when triplet-triplet interactions are maximized with respect to the exciton diffusion efficiency. If a different material were to be incorporated as the sensitizer-free spacer layer that possesses a triplet energy slightly lower than that of the sensitizer host, then the sensitized triplets can be driven energetically into the spacer layer, thus counteracting the triplet dilution effect encountered in the case where the sensitizer host and spacer materials are identical.

As seen in the exciton energy diagrams in FIG. 2b, in the SS-IBSC, TTA-UC enables the harvesting of α-6T triplets whose energy can be used towards populating CT states instead of being wasted. In the TSSC, however, TTA-UC is a loss process because for each pair of α-6T triplets that could have previously populated two CT states, instead only one CT state is populated by the resulting singlet, with more than 1 eV excess energy lost as heat. Because of these contrasting behaviors, studying the change in photocurrent generation under different degrees of TTA-UC in these two devices presents a unique opportunity to confirm the functionality of an SS-IBSC device.

Figure 5:
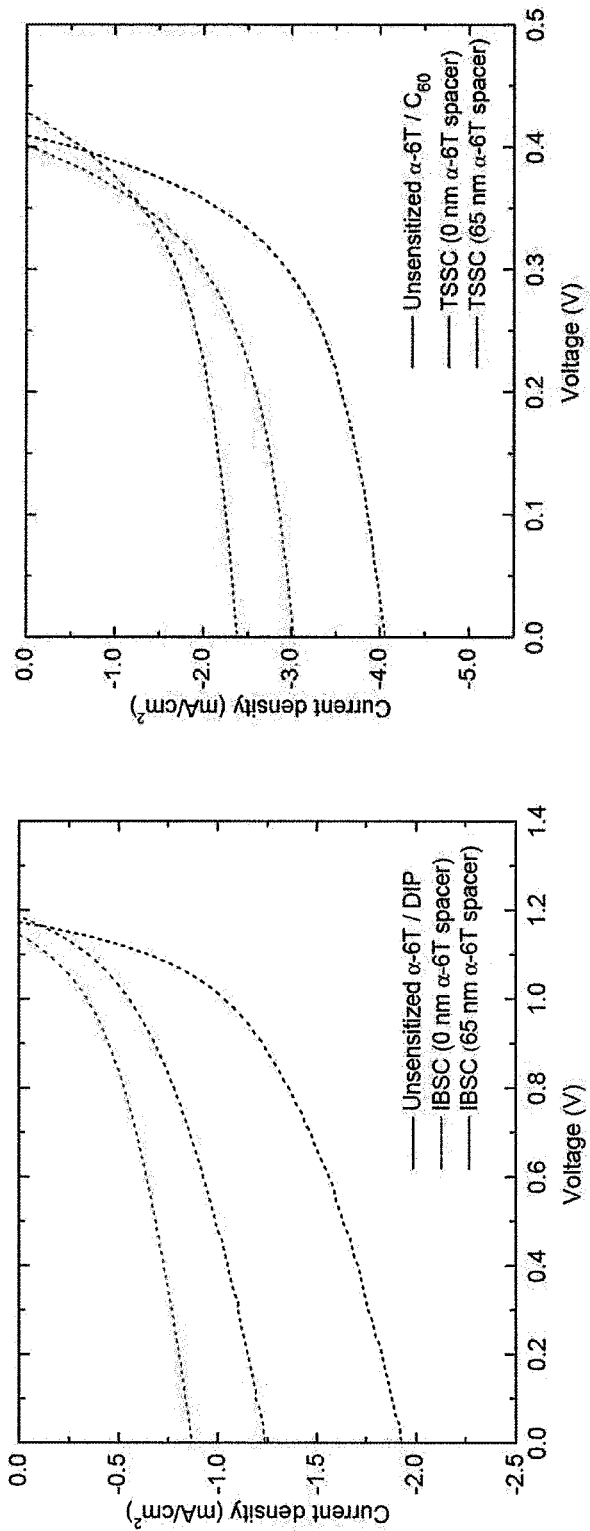
FIG. 5 illustrates representative current density-voltage curves of α-6T/DIP devices according to some embodiments.

The current-voltage characteristics of the SS-IBSC and TSSC devices were measured in dark and 1 sun conditions, with results shown in FIG. 5. It is noteworthy that the presence of the PtTPBP sensitizer does not affect the open-circuit voltage ($V_{OC}$) of either the IBSC or TSSC devices. This is an encouraging sign that PtTPBP, which has a nearly resonant highest occupied molecular orbital (4.9 eV) compared to α-6T (4.85 eV), does not act as a hole trap. It also implies that the introduction of intermediate PtTPBP triplet states does not interfere with charge extraction via the α-6T band edges. In the current-voltage data, we also observe a positive trend in device short-circuit current ($J_{SC}$) as a function of spacer thickness for IBSCs and a negative trend for TSSCs. While we recognize that broadband photocurrent generation in these devices is affected by many variables (e.g. amount of light absorption, thin-film interference, differences in exciton diffusion), the fact that the trends are opposite for each series of devices is nevertheless revealing. Given that both IBSC and TSSC devices were fabricated with nominally identical α-6T:PtTPBP and subsequent α-6T spacer layers, absorption and exciton diffusion characteristics within the donor layer should be similar for both series of devices. The $J_{SC}$ under broadband 1 sun illumination is dominated by α-6T singlet absorption, but these singlets are subject to triplet sensitization via nearby PtTPBP sites, and have the opportunity to undergo TTA-UC with other triplets. The likelihood of these annihilating encounters increases (at least initially) in devices with a high volume of α-6T (i.e. large spacer) and is therefore consistent with the opposite trends observed in the $J_{SC}$ of IBSC and TSSC devices. At the largest spacer thicknesses, reduced exciton diffusion efficiency may override the effects of increased TTA-UC, such that the photocurrent response plateaus.

As another method of modulating the degree of TTA-UC in these devices, EQE measurements in the presence of a background white light were performed. Results of the measurement are provided in FIGS. 6a-6e. In these measurements, the EQE of each device was measured using conventional lock-in detection techniques involving a chopped monochromatic source and an unchopped background light, thereby limiting our study to interactions between excitons originating from the monochromatic and background beams. Changes in the locked-in signal may therefore be linked to the presence of higher concentrations of background excitons (or polarons) in the device. Because the background light is broadband, it is able to excite α-6T singlet excitons, which can then undergo the sensitization process through PtTPBP to yield α-6T triplets.

Figure 6:
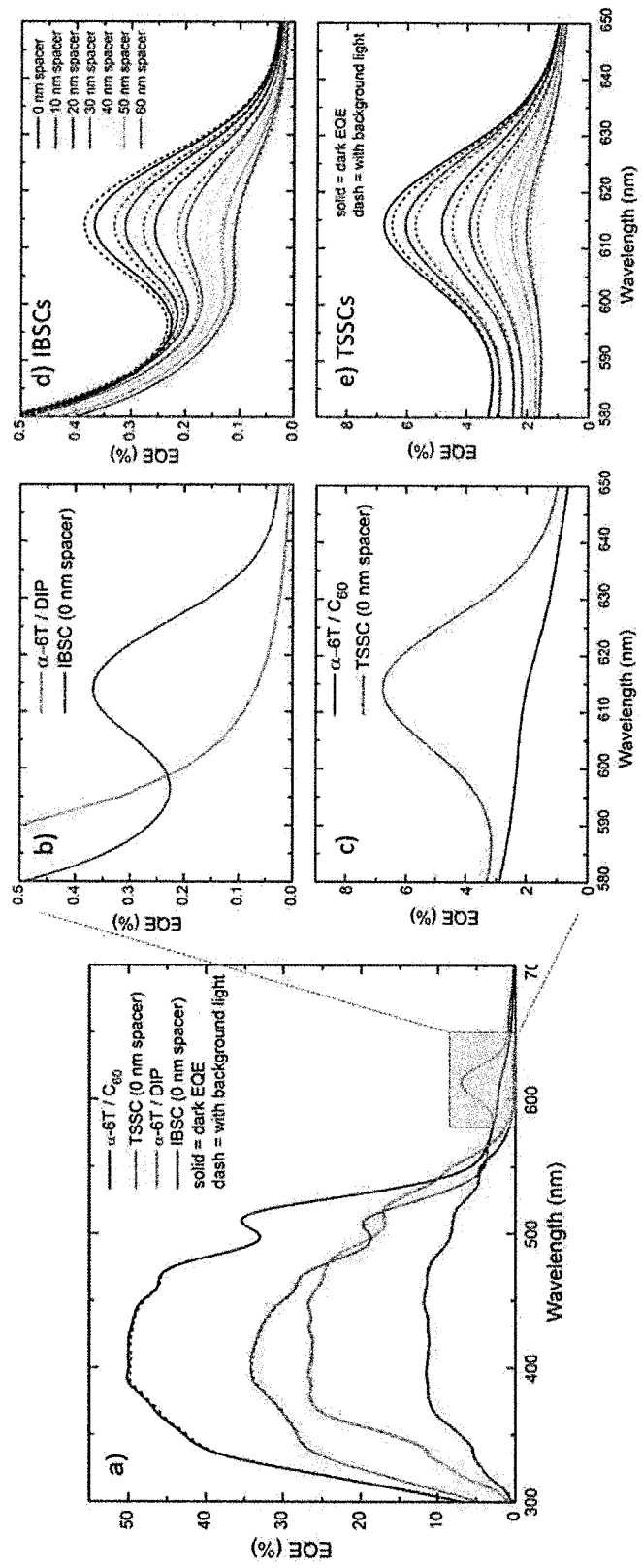
FIG. 6a illustrates full EQE spectra of select photovoltaic devices with and without background light according to some embodiments.
FIGS. 6b and 6c illustrate EQE spectra of SS-IBSC and TSSC respectively in the region of PtTPBP absorption, showing new sub-bandgap contributions to photocurrent that are absent in unsensitized devices.
FIGS. 6d and 6e are EQE spectra for SS-IBSC and TSSC devices in the presence of a background white light (dashed lines) according to some embodiments.

The EQE spectra of select SS-IBSC and TSSC devices with (dashed) and without (solid) the background light are shown in FIGS. 6d and 6e around the region of selective PtTPBP excitation. As reasoned earlier, direct excitations on the PtTPBP are sub-bandgap absorption events that cannot be directly collected by the SS-IBSC. In line with our expectations, the SS-IBSC and TSSC show markedly different behaviors in the presence of the background light: the SS-IBSC experiences an enhancement in photocurrent generation while the TSSC experiences a reduction. The magnitude of these enhancements and reductions in the 615 nm EQE response, shown in FIGS. 6d and 6e, are on the order of several percent (see also, FIG. 7a).

Figure 7:
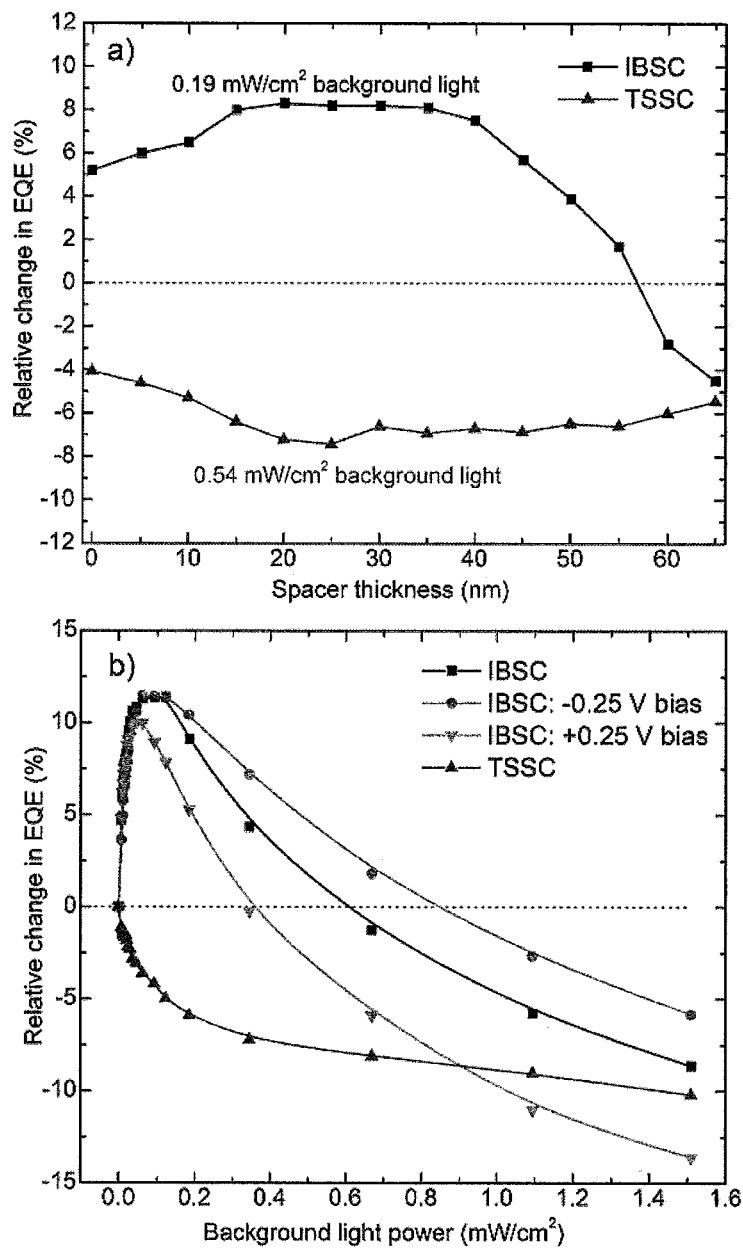
FIG. 7a illustrates percentage change in device EQE under constant background light bias at the peak of PtTPBP absorption (615 nm) as a function of the α-6T spacer thickness for SS-IBSC and TSSC according to some embodiments.
FIG. 7b illustrates percent change in 615 nm EQE response of the SS-IBSC with a 20 nm α-6T spacer and TSSC with a 25 nm α-6T spacer as a function of white light intensity.

Plotted in FIG. 7a is the percentage change in device EQE under constant background light bias at the peak of PtTPBP absorption (615 nm) as a function of the α-6T spacer thickness. In the IBSC, the maximum enhancement in photocurrent was achieved in a device with a 20 nm spacer layer, although a broad optimum exists between 15 and 40 nm. The eventual drop-off in the enhancement at large spacer thicknesses likely reflects a tradeoff between TTA-UC efficiency and exciton diffusion efficiency to the dissociating interface. In the TSSC, the maximum reduction in photocurrent was observed in a device with a 25 nm spacer layer.

An additional study was conducted to observe how the photocurrent response of these two devices evolved under different background light intensities, with results shown in FIG. 7b. In the presence of a background white light, the SS-IBSC experiences a rapid enhancement in photocurrent generation at low background light intensities, peaking at 12% relative photocurrent enhancement under a background intensity less than 0.1 mW/cm$^2$. Eventually, however, there is a gradual drop-off as the background light intensity is increased further. One possibility for this loss in performance is the presence of exciton-polaron annihilation (EPA), which dominates at higher background intensities. To test this theory, the intensity-dependent measurements were repeated while the SS-IBSC device was kept at a moderate forward or reverse voltage bias. Under a reverse voltage bias, polarons are rapidly swept out of the device, therefore reducing their chance of interaction with the excitons being probed by the EQE measurement. On the other hand, a forward voltage bias inhibits the extraction of polarons, providing greater opportunity for EPA. The data shown in FIG. 7b confirm the theory, with the SS-IBSC under reverse bias experiencing less of a drop-off in performance at high background intensities and the IBSC under forward bias experiencing a more severe drop-off compared to the unbiased case. Moreover, the performance at low background intensities is largely unaffected, suggesting that EPA is only a major influence under high polaron concentrations.

Device Fabrication.

Organic materials were purchased from commercial vendors and purified by thermal gradient sublimation prior to use. PtTPBP was synthesized using a procedure described previously and used without further purification. Samples used for spectroscopy were fabricated on clean quartz substrates while samples used for device studies were fabricated on clean patterned indium tin oxide (ITO) substrates, upon which low conductivity poly(3,4-ethylenedioxythiophene): polystyrene sulfonate (PEDOT:PSS) (Heraeus Clevios P VP AI 4083) was spin-coated in ambient air and annealed at 110° C. for 10 min. Organic films and aluminum top-contacts were deposited by vacuum thermal evaporation. Doping was achieved by coevaporation of the PtTPBP and α-6T from two sources with independent deposition rate monitors. The area of each device was 0.1 cm$^2$. All samples were encapsulated in a dry N$_2$ environment using a glass (for devices) or quartz (for spectroscopy samples) cover and solvent-free epoxy.

Device Characterization.

External quantum efficiency measurements were performed using a Newport TLS-300X tunable light source system. Device spectral response was measured under short-circuit conditions using a Stanford Research Systems SR570 current pre-amplifier and SR830 lock-in amplifier. A calibrated Newport Si photodiode served as the reference. Background white light was provided by a set of standard 5 mm LEDs with a diffuser to improve uniformity. In these measurements, the EQE of each device was measured using conventional lock-in detection techniques involving a chopped monochromatic source and an unchopped background light, thereby limiting our study to interactions between excitons originating from the monochromatic and background beams. For EQE scans performed in the presence of the background white light, each "light" scan was compared against a "dark" scan performed immediately before under otherwise identical conditions, in order to exclude drift in the signal over time. For voltage bias measurements shown in FIG. 7b, the voltage was provided by the SR570 current pre-amplifier and was applied to both "light" and "dark" scans. Electroluminescence (EL) spectra were measured under constant current bias (5 mA/cm$^2$ for the α-6T/DIP device and 1.6 A/cm$^2$ for the α-6T/C$_{60}$ device) using a Horiba fibre-coupled spectrograph with a Si CCD array cooled to −60° C. (for the α-6T/DIP device) and an InGaAs array cooled to −100° C. (for the α-6T/C$_{60}$ device). All measurements were calibrated using an Ocean Optics LS-1 tungsten halogen light source.

Steady-State and Transient Spectroscopy.

Absorption spectra were recorded on an Agilent Cary 60 UV-Vis spectrophotometer and Horiba PTI QuantaMaster 400 spectrofluorometer. The absorption of the films was 0.08 at 520 nm for α-6T, and 0.03 and 0.08 at 620 nm for α-6T:PtTPBP and polystyrene:PtTPBP, respectively.

Femtosecond transient absorption spectra were recorded using a Helios transient absorption spectrometer (Ultrafast Systems). Measurements were conducted at magic angle with beam diameters on the sample around 310 μm at 620 nm, around 1000 μm at 520 nm (note that an imperfect beam shape in the particular experiments done at this wavelength allows only a rough approximation of the value) and 130 μm for the white light probe. The excitation energy was varied between 12.5 and 100 nJ at 620 nm giving a fluence of ~0.016 to 0.13 mJ/cm$^2$ with a linear dependence of the signal intensity as a function of the excitation energy. The pulse energies resulted in an excitation density on the order of 6×10$^{17}$ to 6×10$^{18}$ photons/cm$^3$ for the 50 nm thick α-6T: PtTPBP (5 wt %) film. The irradiance at 520 nm was 150 giving a fluence of approximately 0.019 mJ/cm$^2$. Global analysis was performed using a procedure described in literature. Briefly, signal amplitudes in the entire wavelength range were analyzed globally starting from 0.25 ps after optical excitation to avoid contributions from artifacts due to pump-probe overlap. Additionally, no deconvolution of the data with the instrument response function was necessary. To satisfactorily reproduce the experimental data, 3 to 5 time constants were used that had been obtained from a nonlinear least squares fit procedure.

Delayed fluorescence spectroscopy was performed using a Horiba iHR fibre-coupled spectrometer and Si CCD array. A 633 nm HeNe laser and a 405 nm diode laser were used as excitation sources. Incident intensity was tuned over several orders of magnitude using neutral density filters and measured with a calibrated Thorlabs Si photodiode.

Various embodiments of the invention have been described in fulfillment of the various objects of the invention. It should be recognized that these embodiments are merely illustrative of the principles of the present invention. Numerous modifications and adaptations thereof will be readily apparent to those skilled in the art without departing from the spirit and scope of the invention.

The invention claimed is:

1. A solid-state organic intermediate-band photovoltaic device comprising:
   an organic electron donor comprising a singlet energy level separated from a triplet energy level by an energy gap;
   an organic electron acceptor; and
   a triplet sensitizer comprising singlet and triplet energy levels falling within the singlet-triplet energy gap of the electron donor.

2. The solid-state organic intermediate-band photovoltaic device of claim 1, wherein the triplet sensitizer is dispersed in a host matrix providing a composite layer.

3. The solid-state organic intermediate-band electronic device of claim 2, wherein the triplet sensitizer is present in an amount of 0.5 to 30 weight percent of the composite layer.

4. The solid-state organic intermediate-band photovoltaic device of claim 1, wherein the triplet sensitizer comprises one or more organic small molecules.

5. The solid-state organic intermediate-band photovoltaic device of claim 1, wherein the triplet sensitizer comprises one or more metal complexes.

6. The solid-state organic intermediate-band photovoltaic device of claim 5, wherein the one or more metal complexes are transition metal complexes.

7. The solid-state organic intermediate-band photovoltaic device of claim 1, wherein the organic electron donor comprises conjugated polymer.

8. The solid-state organic intermediate-band photovoltaic device of claim 1, wherein the triplet energy level of the triplet sensitizer is higher than the triplet energy level of the organic electron donor by 0.05 eV to 0.2 eV.

9. The solid-state organic intermediate-band photovoltaic device of claim 1, wherein the triplet sensitizer absorbs radiation in the range of 500 nm to 1500 nm.

10. The solid-state organic intermediate-band photovoltaic device of claim 2, wherein the composite layer forms a heterojunction with the electron acceptor.

11. The solid-state organic intermediate-band photovoltaic device of claim 10, wherein the host matrix comprises matrix electron donor.

12. The solid-state organic intermediate-band photovoltaic device of claim 2 further comprising a spacer layer arranged between the composite layer and the electron acceptor.

13. The solid-state organic intermediate-band photovoltaic device of claim 12, wherein the spacer layer comprises the organic electron donor.

14. The solid-state organic intermediate-band photovoltaic device of claim 13, wherein an interface between the organic electron donor and organic electron acceptor establishes a charge transfer interface with the singlet-triplet energy gap of the electron donor.

15. The solid-state organic intermediate-band photovoltaic device of claim 12, wherein the spacer layer supports triplet-triplet annihilation upconversion (TTA-UC).

16. The solid-state organic intermediate-band photovoltaic device of claim 15, wherein the TTA-UC populates the singlet energy level of the organic electron donor.

17. The solid-state organic intermediate-band photovoltaic device of claim 12, wherein the spacer layer has thickness less than 100 nm.

18. The solid-state organic intermediate-band photovoltaic device of claim 2, wherein the composite layer supports TTA-UC.

19. The solid-state organic intermediate-band photovoltaic device of claim 1, wherein the singlet-triplet energy gap of the electron donor is 0.5 eV to 1 eV.

20. The solid-state organic intermediate-band photovoltaic device of claim 1, wherein the organic electron donor has peak radiation absorption less than 600 nm.

* * * * *